United States Patent
Mebarki et al.

(10) Patent No.: US 9,865,466 B2
(45) Date of Patent: Jan. 9, 2018

(54) SILICIDE PHASE CONTROL BY CONFINEMENT

(71) Applicant: Applied Materials, Inc., Santa Clara, CA (US)

(72) Inventors: Bencherki Mebarki, Santa Clara, CA (US); Ellie Y. Yieh, San Jose, CA (US); Mehul B. Naik, San Jose, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/240,410

(22) Filed: Aug. 18, 2016

(65) Prior Publication Data

US 2017/0092502 A1 Mar. 30, 2017

Related U.S. Application Data

(60) Provisional application No. 62/232,848, filed on Sep. 25, 2015.

(51) Int. Cl.
*H01L 21/44* (2006.01)
*H01L 21/285* (2006.01)
(Continued)

(52) U.S. Cl.
CPC .. *H01L 21/28518* (2013.01); *H01L 21/02532* (2013.01); *H01L 21/324* (2013.01); *H01L 21/76864* (2013.01); *H01L 23/528* (2013.01)

(58) Field of Classification Search
CPC ... H04L 5/0037; H04L 5/0007; H04L 5/0055; H04L 5/0094; H04L 5/0023;
(Continued)

(56) References Cited

U.S. PATENT DOCUMENTS

| | | | | |
|---|---|---|---|---|
| 7,592,232 B2 * | 9/2009 | Hirano | ............. | H01L 21/28123 438/301 |
| 7,704,858 B2 * | 4/2010 | McSwiney | ............. | C23C 16/18 257/E21.165 |

(Continued)

OTHER PUBLICATIONS

K. Ogata, et al., Ni-Silicide Growth Kinetics in Si and Si/SiO2 Core/Shell Nanowires, Nanotechnology 22, 365305, Oct. 27, 2011, 9 pages.

*Primary Examiner* — Vu A Vu
(74) *Attorney, Agent, or Firm* — Patterson + Sheridan LLP

(57) ABSTRACT

Implementations described herein generally relate to methods of selective deposition of metal silicides. More specifically, implementations described herein generally relate to methods of forming nickel silicide nanowires for semiconductor applications. In one implementation, a method of processing a substrate is provided. The method comprises forming a silicon-containing layer on a surface of a substrate, forming a metal-containing layer comprising a transition metal on the silicon-containing layer, forming a confinement layer on exposed surfaces of the metal-containing layer and annealing the substrate at a temperature of less than 400 degrees Celsius to form a metal silicide layer from the silicon-containing layer and the metal-containing layer, wherein the confinement layer inhibits formation of metal-rich metal silicide phases.

16 Claims, 5 Drawing Sheets

(51) Int. Cl.
*H01L 21/02* (2006.01)
*H01L 21/324* (2006.01)
*H01L 21/768* (2006.01)
*H01L 23/528* (2006.01)

(58) Field of Classification Search
CPC ............. H01L 21/28518; H01L 23/528; H01L 21/76864; H01L 21/02532; H01L 21/324
USPC ........................................................ 438/682
See application file for complete search history.

(56) References Cited

U.S. PATENT DOCUMENTS

| | | | |
|---|---|---|---|
| 8,614,434 B2 * | 12/2013 | Bangsaruntip | B82Y 10/00 257/9 |
| 8,815,738 B2 * | 8/2014 | Hsu | H01L 29/665 257/E21.333 |
| 2008/0227280 A1 * | 9/2008 | Hase | H01L 21/26513 438/587 |
| 2008/0315430 A1 * | 12/2008 | Weber | B82Y 10/00 257/774 |
| 2011/0287318 A1 | 11/2011 | Loveness et al. | |
| 2012/0115310 A1 * | 5/2012 | Miu | C30B 29/52 438/478 |
| 2013/0011736 A1 | 1/2013 | Loveness et al. | |
| 2013/0171465 A1 | 7/2013 | Jin et al. | |
| 2013/0344383 A1 | 12/2013 | Loveness et al. | |

* cited by examiner

SILICIDE PHASE CONTROL BY CONFINEMENT

CROSS-REFERENCE TO RELATED APPLICATIONS

This application claims benefit of U.S. provisional patent application Ser. No. 62/232,848, filed Sep. 25, 2015. The aforementioned related patent application is herein incorporated by reference in its entirety.

BACKGROUND

Field

Implementations described herein generally relate to methods of selective deposition of metal silicide. More specifically, implementations described herein generally relate to methods of forming metal silicide nanowires for semiconductor applications.

Description of the Related Art

Integrated circuits have evolved into complex devices that can include millions of components (e.g., transistors, capacitors and resistors) on a single chip. The evolution of chip designs continually necessitates faster circuitry and greater circuit densities. The demand for greater circuit densities necessitates a reduction in the dimensions of the integrated circuit components.

Copper (Cu) interconnects have been used as a replacement for Aluminum (Al) for decades. The number of transistors formed on a substrate is reaching the multi-millions range packed in small areas consistent with Moore's law. As the number of transistors increases and the size of the transistors decreases, Cu resistivity is exponentially increasing once the metal line dimension approaches or gets below the Cu mean free path of 39 nanometers ("nm").

The post copper era necessitates new interconnect materials that have low resistivity and narrower mean free path. The mean free path is the average distance traveled by a moving particle (such as an electron, an atom, or a photon) between successive impacts (collisions), which modify the direction or energy or other particle properties of the moving particle. Some metals already under investigation include cobalt (Co), tungsten (W), and some metal alloys. Silicides, such as Nickel Silicide (Ni—Si) interconnects and Cobalt Silicide (CoSi$_2$) interconnects are strong potential candidates given the small mean free path of approximately 5 nm for Ni—Si. Even though Ni—Si resistivity is higher than Cu resistivity, the Ni—Si narrow mean free path of approximately 5 nm gives Ni—Si a strong advantage to replace Cu for advanced future technology nodes of 7 nm and below.

However, current processing methods are not amenable to direct device integration for the strong potential candidates. Most studies involving silicide nanowires have been done with freestanding nanowires, as current processing methods can lead to dielectric damage, thermal budget issues, lattice defects and other problems. Regarding thermal budget issues, low resistivity Ni—Si phase formation typically involves high anneal temperatures of greater than 650 degrees Celsius. These high anneal temperatures are not suitable in back-end-of-line (BEOL) integration, due in part to the temperature budget limitation (e.g., less than about 400 degrees Celsius) of most low-k materials. However, annealing Ni—Si at temperatures lower than 650 degrees Celsius leads to volume expansion of the Ni—Si and formation of high resistivity Ni—Si phases.

Therefore, there is a need for methods of forming low resistivity Ni—Si phase at low temperatures that are suitable for semiconductor manufacturing applications.

SUMMARY

Implementations described herein generally relate to methods of selective deposition of metal silicides. More specifically, implementations described herein generally relate to methods of forming nickel silicide nanowires for semiconductor applications. In one implementation, a method of processing a substrate is provided. The method comprises forming a silicon-containing layer on a surface of a substrate, forming a metal-containing layer comprising a transition metal on the silicon-containing layer, forming a confinement layer on exposed surfaces of the metal-containing layer, and annealing the substrate at a temperature of less than 400 degrees Celsius to form a metal silicide layer from the silicon-containing layer and the metal-containing layer. The confinement layer inhibits formation of metal-rich metal silicide phases.

In another implementation, a method or processing a substrate is provided. The method comprises forming a silicon-containing nanowire on an oxide-containing surface of a substrate, forming a nickel-containing layer on the silicon-containing nanowire, forming a confinement layer on exposed surfaces of the nickel-containing layer, and annealing the substrate at a temperature of less than 400 degrees Celsius to form a nickel monosilicide nanowire from the silicon-containing layer and the nickel-containing layer. The confinement layer inhibits formation of nickel-rich nickel silicide phases.

In yet another implementation, a method of processing a substrate is provided. The method comprises forming a silicon-containing nanowire on an oxide-containing surface of a substrate by depositing a silicon-containing layer on the oxide-containing surface and patterning the silicon-containing layer to form at least one silicon-containing nanowire on the oxide-containing surface. The method further comprises forming a nickel-containing layer on the silicon-containing nanowire, forming a confinement layer on exposed surfaces of the nickel-containing layer, and annealing the substrate at a temperature of between about 15 degrees Celsius and 400 degrees Celsius to form a nickel monosilicide nanowire from the silicon-containing nanowire containing layer and the nickel-containing layer. The confinement layer inhibits formation of nickel-rich nickel silicide phases.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
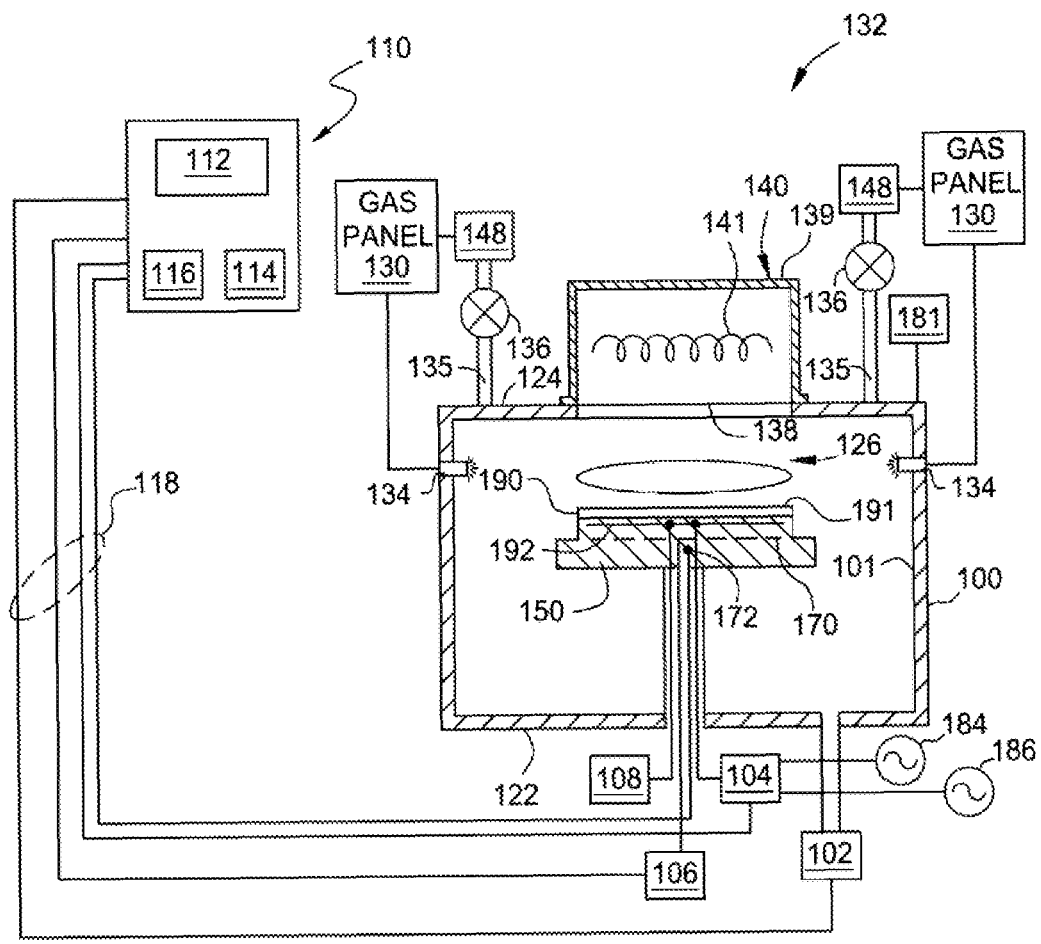
FIG. 1A is a cross-section schematic view of one implementation of a plasma processing chamber adapted to perform a vapor deposition process according to implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes methods of forming metal silicide nanowires at low temperatures for semiconductor applications. Certain details are set forth in the following description and in FIGS. 1A-3E to provide a thorough understanding of various implementations of the disclosure. Other details describing well-known structures and systems often associated with metal silicide formation and semiconductor applications are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein provide methods of forming low resistivity metal silicide (e.g., Ni—Si) phase at low temperatures (e.g., less than 400 degrees Celsius) that are suitable for semiconductor manufacturing applications. The formation of low resistivity metal silicide phase typically involves high anneal temperatures of greater than 650 degrees Celsius. However, these high anneal temperatures are not suitable in most semiconductor manufacturing applications, including back-end-of-line (BEOL) integration, due in part to the temperature budget limitation (e.g., less than about 400 degrees Celsius) of low-k materials. However, annealing of metal silicides at temperatures lower than 400 degrees Celsius leads to volume expansion of the metal silicide and formation of high resistivity metal-rich metal silicide phase materials. Implementations described herein provide for a confinement layer that physically reduces, chemically reduces, or both physically and chemically reduces volume expansion of the underlying silicon-containing layer and the underlying metal-containing layer during subsequent annealing processes. Thus, the confinement layer as described herein provides for the production of low resistivity metal silicides at production temperatures less than 400 degrees Celsius.

Implementations described herein will be described below in reference to a nickel silicide process that can be carried out using a suitably adapted CENTURA®, Producer® SE or Producer® GT processing system, available from Applied Materials, Inc. of Santa Clara, Calif. Other tools capable of performing nickel silicide processes may also be adapted to benefit from the implementations described herein. In addition, any system enabling the nickel silicide processes described herein can be used to advantage. The apparatus description described herein is illustrative and should not be construed or interpreted as limiting the scope of the implementations described herein.

Implementations of the present disclosure describe methods for forming a metal silicide layer that may be utilized as conductive nanowires in, for example, back-end interconnect structures for semiconductor device manufacturing. In one example, the metal silicide layer is formed by a deposition process at a temperature less than 400 degrees Celsius. The metal silicide nanowires can be deposited using a cyclic deposition technique. Suitable deposition techniques may be utilized to form the metal silicide layer include plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD), atomic layer deposition (ALD), and the like, or any suitable deposition techniques. Implementations disclosed herein are more clearly described with reference to the figures below.

As used herein, unless otherwise stated, reference to nanowires is intended to include other types of nanostructures including nanotubes, nanoparticles, nanospheres, nanorods, nanowhiskers, and the like. Nanowires may have an aspect ratio of greater than one, typically at least about two and more frequently at least about four. In specific implementations, nanowires have an aspect ratio of at least 10 and even at least about 100. Nanowires may make use of their one larger dimension to connect to other semiconductor components.

As used herein, unless otherwise stated, a metal-rich metal silicide phase refers to a metal silicide phase where the number of metal atoms is greater than the number of silicon atoms. For example, nickel-rich nickel silicide phases include $Ni_3Si$, $Ni_{31}Si_{12}$, $Ni_2Si$, and $Ni_3Si_2$.

FIG. 1A is a cross sectional view of a plasma processing system 132 suitable for forming a metal silicide layer that may be utilized as conductive nanowires for semiconductor device manufacturing. The plasma processing system 132 may be a suitably adapted CENTURA®, Producer® SE or Producer® GT processing system available from Applied Materials, Inc., of Santa Clara, Calif. It is contemplated that other processing systems, including those produced by other manufacturers, may benefit from implementations described herein.

The plasma processing system 132 includes a processing chamber 100 coupled to a controller 110. The processing chamber 100 generally includes a lid 124, a sidewall 101, and a bottom wall 122 that define a processing region 126.

A support pedestal 150 is provided in the processing region 126 of the processing chamber 100. The support pedestal 150 may be fabricated from aluminum, ceramic, and other suitable materials. In one implementation, the support pedestal 150 is fabricated by a ceramic material, such as aluminum nitride, which is a material suitable for use in a high temperature environment, such as a plasma process environment, without causing thermal damage to the support pedestal 150. The support pedestal 150 may be moved in a vertical direction inside the processing chamber 100 using a lift mechanism (not shown).

The support pedestal 150 may include an embedded heater element 170 suitable for controlling the temperature of a substrate 190 supported on the support pedestal 150. In one implementation, the support pedestal 150 may be resistively heated by applying an electric current from a power supply 106 to the embedded heater element 170. In one implementation, the embedded heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the embedded heater element 170, thus maintaining the substrate 190 and the support pedestal 150 at a substantially constant temperature during film deposition at any suitable temperature range. In another implementation, the pedestal may be maintained at room temperature as needed. In yet another implementation, the support pedestal 150 may also include a chiller (not shown) as needed to cool the support pedestal 150 at a range lower than room temperature as needed. The supplied electric current may be adjusted to selectively control the temperature of the support pedestal 150 between, for example, between about 15 degrees Celsius and about 400 degrees Celsius (between about 50 degrees Celsius and about 350 degrees Celsius; between about 200 degrees Celsius and about 300 degrees Celsius).

A temperature sensor 172, such as a thermocouple, may be embedded in the support pedestal 150 to monitor the temperature of the support pedestal 150 in a conventional manner. The measured temperature is used by the controller 110 to control the power supplied to the embedded heater element 170 to maintain the substrate at a desired temperature.

The support pedestal 150 generally includes a plurality of lift pins (not shown) disposed therethrough that are configured to lift the substrate 190 from the support pedestal 150 and facilitate exchange of the substrate 190 with a robot (not shown) in a conventional manner.

The support pedestal 150 comprises at least one electrode 192 for retaining the substrate 190 on the support pedestal 150. The electrode 192 is driven by a chucking power source 108 to develop an electrostatic force that holds the substrate 190 to the pedestal surface. Alternatively, the substrate 190 may be retained to the support pedestal 150 by clamping, vacuum or gravity.

In one implementation, the support pedestal 150 is configured as a cathode having the electrode 192 embedded therein and coupled to at least one RF bias power source 184, 186. Although the example depicted in FIG. 1A shows two RF bias power sources, 184, 186, it is noted that any number of RF bias power sources may be used as needed. The RF bias power sources 184, 186 are coupled between the electrode 192 disposed in the support pedestal 150 and another electrode, such as a gas distribution plate 142 (depicted in FIG. 1B) or ceiling (lid 124) of the processing chamber 100. The RF bias power sources 184, 186 excite and sustain a plasma discharge formed from the gases disposed in the processing region 126 of the processing chamber 100.

In the implementation depicted in FIG. 1A, the RF bias power sources 184, 186 are coupled to the electrode 192 disposed in the support pedestal 150 through a matching circuit 104. The signal generated by the RF bias power sources 184, 186 is delivered through matching circuit 104 to the support pedestal 150 through a single feed to ionize the gas mixture provided in the processing chamber 100, thus providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom wall 122 of the processing chamber 100. The vacuum pump 102 is used to maintain a desired gas pressure in the processing chamber 100. The vacuum pump 102 also evacuates post-processing gases and by-products of the process from the processing chamber 100.

A light source 140 is disposed on the processing chamber 100 partially defining the lid 124 of the processing chamber 100. The light source 140 is configured to provide heat energy to the substrate 190 disposed on the support pedestal 150 through a window 138. The window 138 is typically made from quartz disposed in the lid 124 of the processing chamber 100 and is at least partially covered by the light source 140.

The light source 140 may comprise various types of radiant heaters. In one example, the light source 140 includes a housing 139 having one or more light sources 141 disposed therein. A power connection (not shown) may be coupled to the light source 140 to facilitate providing power to the one or more light sources 141. In one example, the one or more light sources 141 disposed in the light source 140 may provide radiant energy, such as an IR radiation and/or longer wavelength of UV radiation having a wavelength between about 400 nm and about 4000 nm, to the substrate 190. In one implementation, radiant energy provided from the one or more light sources 141 is believed to enhance photons generated from the plasma to be emitted to the substrate 190 to facilitate chemical reaction during processing. The one or more light sources 141 provide IR and/or UV light, e.g., photons, in the plasma, thus enhancing distribution of photons across a surface 191 of the substrate 190.

The processing chamber 100 includes one or more gas delivery passages 135 coupled through the lid 124 or sidewalls 101 of the processing chamber 100. The one or more gas delivery passages 135 and the vacuum pump 102 are positioned at opposite ends of the processing chamber 100 to induce laminar flow within the processing region 126 to minimize particulate contamination. In one implementation, two more gas delivery passages 135 are disposed through the lid 124 of the processing chamber 100. The one or more gas delivery passages 135 typically is coupled to a valve 136 to selectively allow processing gases from the gas panel 130 flowing into and out of the processing region 126. Alternatively, the additional passages 134 may be positioned at adjacent sidewalls 101 to provide a more uniform gas distribution across the surface 191 of the substrate 190.

The one or more gas delivery passages 135 are coupled to the gas panel 130 through the valve 136 to provide a gas mixture into the processing region 126. In one implementation, the one or more gas delivery passages 135 may be configured as a gas distribution ring wherein the gas mixture may be distributed from adjacent the sidewalls 101 through an array of holes to optimize the flow uniformity. In another implementation, the gas mixture may be supplied to the processing chamber 100 through a gas distribution plate 142 (shown in FIG. 1B) disposed below the light source 140. The gas distribution plate 142 may be fabricated by a material transmissive to the heat generated from the light source 140 such as not to substantially interfere with the heating of the substrates positioned on the support pedestal 150.

Examples of gases that may be supplied from the gas panel 130 may include a metal-containing precursor gases, silicon-containing precursor gases, and carrier gases. Any suitable metal-containing precursor gases, silicon-containing precursor gases, and carrier gases may be used. Suitable nickel-containing compounds include nickel carbonyl complexes, nickel amidinate compounds, nickelocene compounds ($Ni(C_5H_5)_2$), nickel dienyl complexes, nickel nitrosyl complexes, or combinations thereof. Examples of suitable nickel-containing compounds include Bis(N,N'-di-tert-butylacetamidinato)nickel(II), Bis(cyclopentadienyl) nickel (i.e., $Ni(C_5H_5)_2$, $NiCp_2$), Bis(ethylpentadienyl) nickel, Bis(ethylcyclopentadienyl)nickel(II) (i.e., $Ni(C_5H_4C_2H_5)_2$), Bis[di(tert-butyl)amido]nickel(II), Ni[N(t-Bu)$_2$]2, Ni[(t-BuN)$_2$(CCH$_3$)]$_2$, Ni[N(t-uut)$_2$], Ni(($^t$Bu$_2$N)$_2$CCH$_3$)$_2$, and $R_xO_vNi_y(OR')_z$, $(OR)_2Ni$, wherein R may be methyl, ethyl, propyl, isopropyl, butyl, isobutyl, tertiary butyl, and other alkyl groups having higher numbers of carbon atoms, and the like and wherein x is greater than or equal to 1, v is greater than or equal to 1, y is greater than or equal to 1, and z is greater than or equal to 1, or any suitable metal-containing precursors, and the like. Other metal-containing precursors may be selected from gases containing transition metal elements, such as Ni, Ti, Fe, Co, Cr, Mn, and combinations thereof. Suitable examples of the silicon-containing precursor can include a silane-containing gas, such as silane ($SiH_4$), disilane ($Si_2H_6$), dichlorosilane ($SiH_2Cl_2$), $Si_4H_{10}$, $Si_5H_{12}$, silicon tetrafluoride ($SiF_4$), silicon tetrachloride ($SiCl_4$), and the like. Suitable carrier gases include nitrogen ($N_2$), argon (Ar), hydrogen ($H_2$), alkanes, alkenes, helium (He), oxygen ($O_2$), ozone ($O_3$), wafer vapor ($H_2O$), and the like.

In one implementation, a remote plasma source (RPS) 148 may be alternatively coupled to the one or more gas delivery passages 135 to assist in forming a plasma in the processing region 126. The remote plasma source 148 provides plasma formed from the gas mixture provided by the gas panel 130 to the processing chamber 100.

Furthermore, a microwave generator 181 may be coupled to the lid 124 (or the sidewalls 101) of the processing chamber 100. Similarly, the microwave generator 181 coupled to the processing chamber 100 may assist dissociating of the gases from the gas mixture to become reactive species to enhance the chemical reaction across the surface 191 of the substrate 190.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the plasma processing system 132 are handled through numerous signal cables collectively referred to as signal buses 118, some of which are illustrated in FIG. 1A.

Figure 1B:
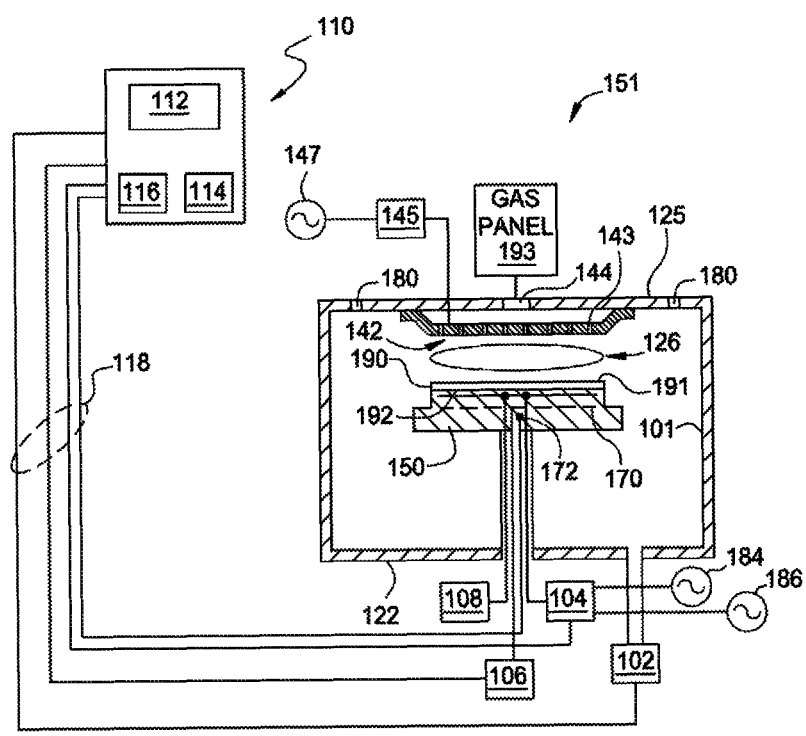
FIG. 1B is a cross-section schematic view of another implementation of a plasma processing chamber adapted to perform a vapor deposition process according to implementations described herein.

FIG. 1B depicts another implementation of a plasma processing chamber 151 that may be utilized to form a metal silicide layer. The configuration of the plasma processing chamber 151 depicted in FIG. 1B is similar to the configuration of the processing chamber 100 depicted in FIG. 1A, but with the gas distribution plate 142 coupled to a lid 125 of the plasma processing chamber 151. Unlike the light source 140 of FIG. 1A disposed above the lid 124 of the processing chamber 100, a light source 180 of the plasma processing chamber 151 depicted in FIG. 1B is formed on an edge of the lid 125 while having the gas panel 193 disposed on a center region 144 of the lid 125 of the plasma processing chamber 151. The light source 180 may be in form of annular arrays. Similarly, the light source 180 is similar to the one or more light sources 141 that may provide radiation that enhances photon generation in the plasma, which may assist chemical reaction occurring on the surface 191 of the substrate 190.

In one example, the gas distribution plate 142 having a plurality of apertures 143 is coupled to the lid 125 of the processing chamber 100 above the support pedestal 150. The apertures 143 of the gas distribution plate 142 are utilized to introduce process gases from the gas panel 193 into the plasma processing chamber 151. The apertures 143 may have different sizes, number, distributions, shape, design, and diameters to facilitate the flow of the various process gases for different process requirements. Plasma is formed from the process gas mixture exiting the gas distribution plate 142 to enhance thermal decomposition of the process gases resulting in the deposition of material on the surface 191 of the substrate 190.

The gas distribution plate 142 and support pedestal 150 may form a pair of spaced apart electrodes in the processing region 126. One or more RF power sources 147 provide a bias potential through a matching network 145 to the gas distribution plate 142 to facilitate generation of a plasma between the gas distribution plate 142 and the support pedestal 150. Alternatively, the one or more RF power sources 147 and matching network 145 may be coupled to the gas distribution plate 142, support pedestal 150, or coupled to both the gas distribution plate 142 and the support pedestal 150, or coupled to an antenna (not shown) disposed exterior to the plasma processing chamber 151. In one implementation, the one or more RF power sources 147 may provide between about 10 Watts and about 3,000 Watts at a frequency of about 30 kHz to about 13.6 MHz. Alternatively, the one or more RF power sources 147 may be a microwave generator that provides microwave power to the gas distribution plate 142 assisting generation of the plasma in the processing region 126.

Figure 2:
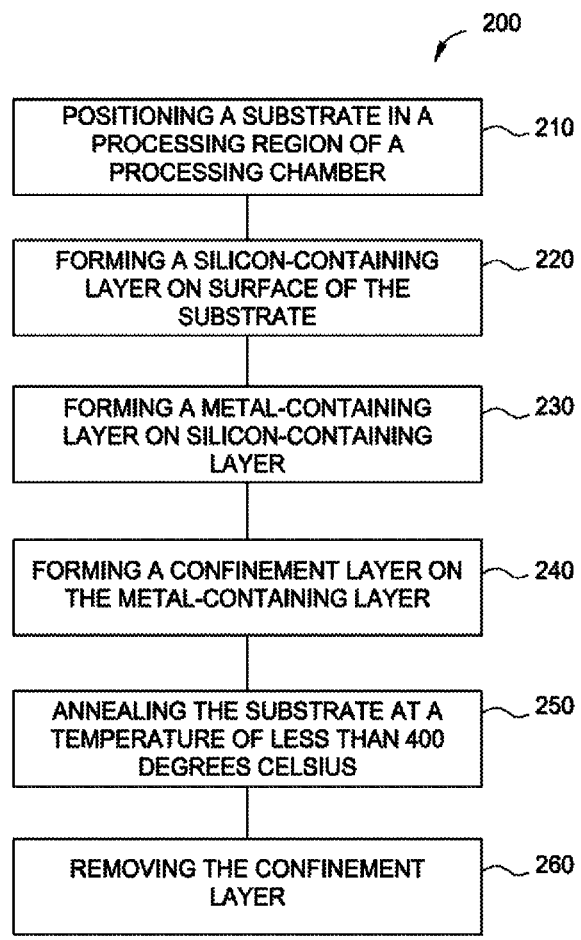
FIG. 2 depicts a flow diagram for forming a metal silicide layer on a substrate according to implementations described herein.

FIG. 2 depicts a flow diagram of a method 200 for forming a metal silicide layer on a substrate at a low temperature, such as less than 400 degrees Celsius, which may be utilized as conductive nanowires for semiconductor device manufacturing. The sequence described in FIG. 2 corresponds to the fabrication stages depicted in FIGS. 3A-3E. FIGS. 3A-3E depict cross sectional schematic views of a metal silicide layer formed on a substrate in accordance with the process of FIG. 2.

Figure 3A:
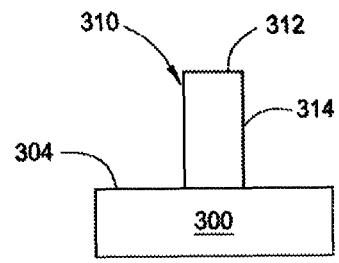
FIGS. 3A-3E depict cross section schematic views of a metal silicide layer formed on a substrate in accordance with the process of FIG. 2.

The method 200 starts with a substrate, such as the substrate 300 depicted in FIG. 3A, disposed in the processing chamber, at operation 210. The processing chamber may be a processing chamber as described above, such as the processing chambers 100 and 151 depicted in FIGS. 1A and 1B, or another suitable processing chamber. The substrate 300 shown in FIG. 3A may include a film stack (not shown) formed on the substrate 300. The film stack may include a barrier layer disposed on a low-k insulating dielectric material. In one implementation, the film stack includes a low-k insulating dielectric material deposited on silicon material. In one example, the substrate 300 may have a substantially planar surface, an uneven surface, or a substantially planar surface having a structure formed thereon.

The substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, and combinations thereof.

The substrate 300 may have various dimensions, such as 200 mm or 300 mm diameter wafers, as well as, rectangular or square panels. The substrate 300 may be provided as a roll, sheet, discrete substrate, or any other form that is fed into a processing chamber used in one or more of subsequent operations. Unless otherwise noted, the implementations and examples described herein are conducted on discrete substrates with a 200 mm diameter, a 300 mm diameter, a 450 mm diameter substrate, or greater. The substrate 300 may have features formed therein. Exemplary features include trenches, vias, plugs, holes, openings, lines, the like and combinations thereof. In one implementation, the substrate 300 may be an oxide-containing substrate, such as, a silicon oxide containing substrate.

The barrier layer included in the film stack may be fabricated from TaN, TiN, AlN, TaSiN, TiSiN, or other suitable materials. The low-k insulating dielectric material may have openings (not shown) formed therein configured to have at least one conductive layer disposed therein laterally bounded by the low-k insulating dielectric material. The low-k insulating dielectric material may be any suitable silicon oxide containing material, silicon nitride containing material, SiOC containing material, SiC containing material, and carbon based material, or any other suitable material. In one example, the low-k insulating dielectric material is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., located in Santa Clara, Calif., and other low-k polymers, such as polyamides. The substrate 300 or the barrier layer may have a feature formed therein.

In certain implementations, the method 200 includes an optional pre-treatment of the surface 304 of the substrate 300. The pre-treatment may be used to modify the surface 304 of the substrate 300 in order to enhance silicide formation or for other purposes. Examples of such pre-treatment include introducing materials used in metal silicide formation (e.g., sources of silicon, sources of the metal, catalysts, and the like), chemically modifying the substrate surface (e.g., forming oxides, nitrides, carbides, initial silicide structures, and treatments with various oxidizing and reducing agents), physically modifying the surface (e.g., increasing surface roughness by laser ablation, knurling, electro-polishing (such as electroplating and reverse-electroplating to increase the surface roughness), changing grain orientation, annealing, treating with oxygen based plasma to form an oxide, treating with argon based plasma to change roughness (e.g., sputter cone formation), sonication, and ion implantation. It should be noted that some of these techniques might be used to control amounts of various materials (e.g., a metal source material) present on the surface as well as the physical characteristics of these materials (e.g., surface roughness). For example, the surface 304 of the substrate 300 may be chemically modified with reducing or oxidizing agents to modify the roughness at a scale particularly useful for facilitating nucleation. Other techniques include oxygen plasma etching. Further, one may treat the surface with a dopant to increase the conductivity of the silicide structure if the dopant diffuses into the silicon reacting metal.

At operation 220, a silicon-containing layer 310 is formed on the surface 304 of the substrate 300. The silicon-containing layer 310 has an upper surface 312 and at least one sidewall 314. The silicon-containing layer 310 may be an amorphous silicon layer. Any suitable deposition technique may be used to form the silicon-containing layer 310. For example, the silicon-containing layer 310 can be deposited using deposition techniques, such as plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD), atomic layer deposition (ALD), and the like, among others. In one implementation, the silicon-containing layer 310 is deposited using a deposition gas. The deposition gas may be part of a silicon-containing deposition gas mixture. The silicon-containing deposition gas mixture may include at least a silicon-containing precursor. The silicon-containing precursor may be any suitable silicon-containing compound. The silicon-containing precursor may include silane ($SiH_4$), disilane ($Si_2H_6$), silicon tetrafluoride ($SiF_4$), silicon tetrachloride ($SiCl_4$), dichlorosilane ($SiH_2Cl_2$), the like, and combinations thereof. The silicon-containing precursor, such as $SiH_4$, can be maintained at a flow rate by volume between about 5 sccm and about 1,000 sccm (e.g., between about 10 sccm and about 500 sccm; between about 50 sccm and about 500 sccm).

In some implementations, the silicon-containing deposition gas mixture further includes a carrier gas. Any suitable carrier gas may be used. Examples of carrier gases that may be supplied in the silicon-containing deposition gas mixture include nitrogen ($N_2$) and nitric oxide (NO), $O_2$, $N_2O$, hydrogen ($H_2$), ammonia ($NH_3$), a mixture of hydrogen ($H_2$) and nitrogen ($N_2$) and/or inert gas, such as argon (Ar) and helium (He). The carrier gas may be supplied with the silicon-containing deposition gas mixture into the processing chamber. The addition of different carrier gases or inert gases may change the film structure and/or film chemical components, such as resistivity, thus adjusting the deposited film to have a desired film property to meet different process requirements.

The volumetric concentration of silane in the carrier gas may be less than about 10% or, more specifically, less than about 5%, or even less than about 1%. In certain implementations, the concentration of silane is about 1%.

The silicon-containing deposition gas mixture may further include an inert gas supplied to assist the profile control as needed. Examples of the inert gas supplied in the silicon-containing deposition gas mixture include Ar, He, Ne, Kr, Xe or the like.

Several process parameters may also be controlled while supplying the silicon-containing deposition gas to perform the deposition process. The pressure of the processing chamber may be controlled at between about 0.5 millitorr and about 5 Torr (e.g., between about 20 millitorr and about 2 Torr; between about; between about 100 millitorr and about 1 Torr). A substrate temperature is maintained less than 400 degrees Celsius, such as between about 15 degrees Celsius to about 400 degrees Celsius (e.g., between about 100 degrees Celsius and about 350 degrees Celsius; between about 200 degrees Celsius and about 300 degrees Celsius). It is believed that low temperatures, temperatures less than 400 degrees Celsius, is desirable in fabricating nanowires for the semiconductor devices to minimize damage, e.g., undesired mechanical densification to the nearly low-k materials or conductive material melt-down, on the fabricated device structures. The deposition process (e.g., either gas delivery) may be performed for between about 30 seconds and about 300 seconds to deposit the silicon-containing layer 310. The resulting silicon-containing layer 310 can have a thickness between about 1 Å and about 1,000 Å (e.g., between about 5 Å and about 200 Å; between about 10 Å and about 100 Å).

In one implementation, the silicon-containing layer 310 is a silicon nanowire. In another implementation, the silicon-containing layer 310 formed on the substrate 300 may be a blanket film that may be utilized to form silicon nanowires. For example, the silicon-containing layer 310 may be later patterned or etched to formed openings in the silicon-containing layer 310 defining the silicon nanowires. For example, the silicon-containing layer may be patterned using an etching process, such as a reactive ion etching process.

In another implementation, operation 220 may be performed on a substrate 300 having a patterned mask (not shown) deposited thereon. The patterned mask may have a height related to the desired height of the resulting silicon nanowires. The patterned mask may have openings formed therein. The openings may be sized relative to the desired diameter of the silicon nanowires. When operation 220 is performed on the substrate 300, the silicon-containing layer 310 may then fill into the openings of the patterned mask to form silicon nanowires.

In general, the silicon nanowires may between about 5 nanometers and 100 nanometers in diameter (e.g., between about 10 nanometers and 50 nanometers; between about 20 nanometers and about 40 nanometers). The silicon nanowires may be between about 1 micrometer and 100 micrometers long (e.g., between about 5 micrometers and 50 micrometers long; between about 12 micrometers and 30 micrometers).

Figure 3B:
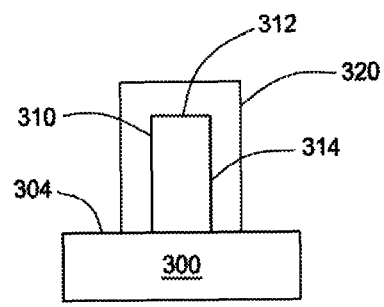

At operation 230, a metal-containing layer 320 is formed on the silicon-containing layer 310. The metal-containing layer 320 has a top surface 322 and at least one sidewall 324. The metal-containing layer 320 may be formed by supplying a metal-containing deposition gas mixture to the processing chamber. The metal-containing layer 320 comprises a transition metal. The transition metal may be selected from a group consisting of nickel (Ni), titanium (Ti), iron (Fe), cobalt (Co), chromium (Cr), manganese (Mn), platinum (Pt), palladium (Pd), and combinations thereof. In one implementation, the metal-containing layer 320 is a nickel layer. In one implementation, the metal-containing layer 320 is a nickel layer doped with palladium or platinum. The metal-containing layer 320 may have a thickness between about 5 nanometers and about 200 nanometers (e.g., between about 10 nanometers and 100 nanometers; between about 20 nanometers and about 80 nanometers). As depicted in FIG. 3B, the metal-containing layer 320 coats the upper surface 312 and the at least one sidewall 314 of the silicon-containing layer 310. In one implementation, the metal-containing layer 320 is a conformal layer relative to the silicon-containing layer 310.

The metal-containing layer 320 can be deposited using any suitable deposition technique. Suitable deposition techniques include plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD), atomic layer deposition (ALD), and the like, among others. In one implementation, the metal-containing layer is deposited using a metal-containing deposition gas mixture. The metal-containing deposition gas mixture includes at least a metal-containing precursor. The metal-containing precursor may be a nickel-containing compound.

In one implementation, the nickel-containing compound may have a formula of $R_xO_vNi_y(OR')_z$, where R and R' are H, $CH_3$, $C_2H_5$, $C_3H_7$, CO, NCO, alkyl or aryl group and x, v and z are integers having a range between 0 and 16 (e.g., between 1 and 12; between 5 and 10) and y is an integer having a range between 0 and 8 (e.g., between 1 and 5; between 2 and 4). In another implementation, the nickel-containing compound may have a formula of $Ni(NRR')_w$, where R and R' may be H, $CH_3$, $C_2H_5$, $CO_3H_7$, CO, NCO, alkyl or aryl group and R' may be H, $CH_3$, $C_2H_5$, $C_3H_7$, CO, NCO, alkyl or aryl group and w is an integer having a range between 0 and 8 (e.g., between 1 and 5; between 2 and 4). Suitable nickel-containing compounds include nickel carbonyl complexes, nickel amidinate compounds, nickelocene compounds ($Ni(C_5H_5)_2$), nickel dienyl complexes, nickel nitrosyl complexes, or combinations thereof. Examples of suitable nickel-containing compounds are Bis(N,N'-di-tert-butylacetamidinato)nickel(II), Bis(cyclo-pentadienyl)nickel (i.e., $Ni(C_5H_5)_2$, $NiCp_2$), Bis(ethylpentadienyl)nickel, Bis(ethylcyclopentadienyl)nickel(II) (i.e., $Ni(C_5H_4C_2H_5)_2$), Bis[di(tert-butyl)amido]nickel(II), $Ni[N(t-Bu)_2]2$, $Ni[(t-BuN)_2(CCH_3)]_2$, $Ni[N(t-uut)_2]$, $Ni(({}^tBu_2N)_2CCH_3)_2$, and $R_xO_vNi_y(OR')_z$, $(OR)_2Ni$, wherein R may be methyl, ethyl, propyl, isopropyl, butyl, isobutyl, tertiary butyl, and other alkyl groups having higher numbers of carbon atoms, and the like and wherein x is greater than or equal to 1, v is greater than or equal to 1, y is greater than or equal to 1, and z is greater than or equal to 1, or any suitable metal-containing precursors, and the like.

The metal-containing layer may be deposited thin by controlling the residency time of the gas present in the process region, by using a self-limiting deposition gas or by other methods. In one implementation, the metal-containing precursor supplied in the deposition gas mixture may be maintained at a flow rate by volume between about 10 sccm and about 500 sccm (e.g., between about 20 sccm and about 200 sccm; between about 50 sccm and about 100 sccm).

In certain implementations, a carrier gas, such as nitrogen ($N_2$) and nitric oxide (NO), $O_2$, $N_2O$, hydrogen ($H_2$), ammonia ($NH_3$), a mixture of hydrogen ($H_2$) and nitrogen ($N_2$) and/or inert gas, such as argon (Ar) and helium (He), may be supplied with the metal-containing deposition gas mixture into the processing chamber. The addition of different carrier gases or inert gases may change the film structure and/or film chemical components, such as resistivity, thus adjusting the deposited film to have a desired film property to meet different process requirements.

The deposition gas mixture may further include an inert gas. The inert gas may also be supplied to assist the profile control as needed. Any suitable inert gas may be used. Examples of the inert gas supplied in the gas mixture include Ar, He, Ne, Kr, Xe or the like.

Several process parameters may also be controlled while supplying the deposition gas to perform the metal-containing layer deposition process. The pressure of the processing chamber may be controlled at between about 0.5 millitorr and about 5 Torr. A substrate temperature is maintained less than 400 degrees Celsius, such as between about 15 degrees Celsius to about 400 degrees Celsius, (e.g., between about 100 degrees Celsius and about 350 degrees Celsius; between about; between about 200 degrees Celsius and about 300 degrees Celsius). It is believed that low temperatures, temperatures less than 400 degrees Celsius, is desirable in fabricating nanowires for semiconductor devices so as to minimize damages, e.g., undesired mechanical densification to the nearly low k materials or conductive material meltdown, on the fabricated device structures. The deposition process (e.g., either gas delivery) may be performed for between about 30 seconds and about 300 seconds to deposit the metal-containing layer 320. The resulting metal-containing layer 320 can have a thickness between about 1 Å and about 1,000 Å (e.g., between about 5 Å and about 200 Å; between about 10 Å and about 100 Å).

At operation 240, a confinement layer 330 is formed on the metal-containing layer 320. The confinement layer 330 may consist of any material suitable enough to physically reduce, chemically reduce, or both physically and chemically reduce volume expansion of the underlying silicon-containing layer 310 and the underlying metal-containing layer 320 during the subsequent annealing process at operation 250. In some implementations, the confinement layer 330 inhibits formation of metal-rich metal silicide phases during the subsequent annealing process at operation 250. In one implementation, the confinement layer 330 inhibits formation of metal-rich metal silicide phases that typically involve volume expansion during the subsequent annealing process at operation 250. In one implementation, the metal silicide phases that typically involve volume expansion are selected from the group consisting of: $Ni_3Si$, $Ni_{31}Si_{12}$, $Ni_2Si$, $Ni_3Si_2$, and combinations thereof. The confinement layer 330 may comprise a metal-based material, an organic-based material, a dielectric material, and combinations thereof. Exemplary dielectric materials include oxide layers, nitride layers, and combinations thereof, among others.

The confinement layer 330 can be deposited using deposition techniques, such as plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD), atomic layer deposition (ALD), and the like, among others. The confinement layer 330 may be deposited using process conditions and techniques known in the art.

Figure 3C:
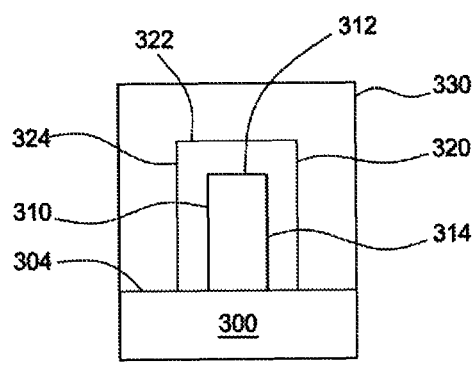
Figure 3D:
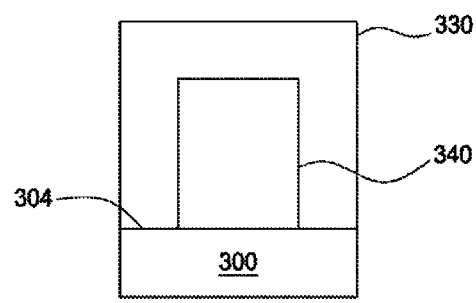
Figure 3E:
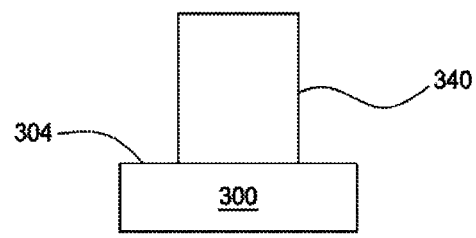

The confinement layer 330 may have any suitable thickness. The confinement layer 330 may have a thickness between about 1 nanometer and 1,000 nanometers (e.g., between about 5 nanometers and about 200 nanometers; between about 10 nanometers and 100 nanometers; between about 20 nanometers and about 80 nanometers). As depicted in FIG. 3C, the confinement layer 330 coats the top surface 322 and the at least one sidewall 324 of the metal-containing layer 320. In one implementation, the confinement layer 330 is a conformal layer relative to the metal-containing layer 320. In one implementation, the confinement layer 330 may be a sacrificial layer.

In certain implementations, the confinement layer 330 comprises any suitable organic-based material. The confinement layer 330 may comprise suitable organic-based material, such as silicon carbide (SiC), nitrogen doped silicon carbide (SiNC), silicon carbon nitride (SiCN), silicon carbon oxide (SiCO), oxygen and nitrogen doped silicon carbide (SiONC), or the like. One example of such a suitable organic based material is BLOk™ (barrier low-k) film, which is available from Applied Materials, Inc. of Santa Clara, Calif. Other suitable organic based materials include carbon doped oxide (CDO) (such as Black Diamond or Black Diamond II, available from Applied Materials), organosilicate glass (OSG), undoped silicon glass (USG), such as silicon oxide or TEOS, boron-silicate glass (BSG), phosphorus-silicate glass (PSG), boron-phosphorus-silicate glass (BPSG), a polymer-based low-k dielectric material (such as SiLK®, available from Dow Chemical Company), an organic polymer (such as FLARE™, a bridged poly-arylene ether available from Honeywell Advanced Microelectronic Materials), the like, and combinations thereof.

In certain implementations, the confinement layer 330 comprises any suitable metal-based material. Suitable metal-based materials include refractory metal nitride materials. Exemplary refractory metal nitride layers are selected from the group consisting of titanium nitride, tantalum nitride and tungsten nitride. Exemplary metal layers include titanium and tungsten.

Several process parameters may be controlled while supplying the gases to deposit the confinement layer 330. The pressure of the processing chamber may be controlled at between about 0.5 millitorr and about 5 Torr. A substrate temperature is maintained less than 400 degrees Celsius (e.g., between about 15 degrees Celsius and about 400 degrees Celsius; between about 100 degrees Celsius and about 350 degrees Celsius; between about; between about 200 degrees Celsius and about 300 degrees Celsius).

At operation 250, the substrate 300 is exposed to an annealing process at a temperature of less than 400 degrees Celsius. Any suitable annealing process may be used. Suitable annealing processes include, for example, high-pressure annealing, micro-annealing, and thermal annealing. In one implementation, the annealing further comprises either radiant energy activation or microwave excitation. After the silicon-containing layer 310 and the metal-containing layer 320 are formed on the substrate 300, a low temperature, such as less than 400 degrees Celsius, thermal/annealing process (e.g., between about 15 degrees Celsius and about 400 degrees Celsius; between about 100 degrees Celsius and about 350 degrees Celsius; between about 200 degrees Celsius and about 300 degrees Celsius). The thermal/annealing process may be performed in a thermal processing chamber, such as a RTP chamber or any suitable heating processing chamber. The thermal processing chamber may be capable of performing a microwave assisted thermal/annealing process. The thermal processing chamber may be similarly configured as the processing chambers described in FIGS. 1A and 1B, with a heating module, such as a lamp or heating assembly formed therein with a microwave generator coupled thereto. The microwave power applied during thermal/annealing process may gently heat/thermal process the silicon-containing layer 310 and the metal-containing layer 320 to form the metal silicide layer 340 without adversely destroying or damaging other film structures present on the substrate 300.

In one example, the microwave power may be operated at a frequency between 0.3 GHz and about 300 GHz. The microwave power may be applied between about 10 Watts and about 5000 Watts. In some implementations, in addition to the microwave power as generated, one or more RF power sources 147 (depicted in FIG. 1A) and/or RF bias power sources 184, 186 (depicted in FIGS. 1A and 1B) may also be generated during the deposition process to assist dissociating the deposition gas mixture forming the plasma. In one example, the RF source power may be supplied between about 100 Watts and about 600 Watts and at a frequency between about 250 kHz and about 13.6 MHz. A RF bias power may also be supplied as needed. The RF bias power may be supplied at between about 10 Watts and about 100 Watts. In one implementation, the RF source power may be pulsed with a duty cycle between about 10 to about 95 percent at a RF frequency between about 500 Hz and about 10 kHz. While performing the thermal/annealing process, a carrier gas may be supplied during the heat/thermal process. The carrier gas may be selected from a group consisting of $N_2$, $O_2$, $H_2$, inert gas, or any suitable gases as needed.

While performing the thermal/annealing process, a microwave power and/or a light radiation may be emitted to the metal silicide layer 340 to enhance reconstruction of the film structures of the metal silicide layer 340, at 250. It is believed that the radiant energy, e.g., photons, may enhance the film structure rearrangement or reconstruction to the metal silicide layer 340. In one implementation, the light radiation may have a wavelength between about 1 mm and about 1000 mm. The light radiation may include an IR light, UV light, and combinations thereof. In one implementation, the metal silicide layer comprises nickel silicide and a majority of the nickel silicide is nickel monosilicide (NiSi) phase. In one implementation, the metal silicide layer is formed as nanowires for a semiconductor back-end interconnection structure.

At operation 260, the confinement layer 330 is removed. The confinement layer 330 may be removed using any process suitable for removing the material of the confinement layer 330 without damaging the underlying metal silicide layer 340 and any other structures present on the substrate 300. The confinement layer 330 may be removed using wet etching processes, plasma etching processes, or both.

In one implementation, the confinement layer 330 is removed using a plasma etching processes. The plasma etching process may include a process gas or process gas mixture comprising at least one of: a fluorocarbon gas, a nitrogen-containing gas, an oxygen-containing gas, an inert gas, and combinations thereof. As used herein, the phrases "a process gas" and "a process gas mixture" are interchangeable and may include one or more gases. Optionally, a hydrofluorocarbon gas may also be provided. In some implementations, the fluorocarbon gas may be hexafluoro-1,3-butadiene ($C_4F_6$), octafluorocyclobutane ($C_4F_8$), octafluorocyclopentene ($C_5F_8$), hexafluorobenzene ($C_6F_6$), tetrafluoromethane ($CF_4$), hexafluoroethane ($C_2F_6$), or the like. The nitrogen-containing gas may be nitrogen ($N_2$). The inert gas may comprise argon (Ar), helium (He), xenon (Xe), or other inert gases. The hydrofluorocarbon gas may be difluoromethane ($CH_2F_2$), trifluoromethane ($CHF_3$), methyl fluoride ($CH_3F$), or the like. In some implementations, the process gas mixture may include $C_4F_6$, $CH_2F_2$, $N_2$, and Ar.

In one implementation, the confinement layer 330 is removed using wet etching processes. In some implementations, the wet chemical may comprise, for example, a hydrofluoric acid solution. During one exemplary wet cleaning process the conductive residues are removed by repeatedly exposing the substrate to cleaning solvents comprising, in various combinations, hydrogen fluoride (HF), ammonium fluoride ($NH_4F$), ammonium hydroxide ($NH_4OH$), hydrogen peroxide ($H_2O_2$), and the like.

The nickel silicide (NiSi) layer as formed herein has high thermal stability, low electrical resistivity and high purity, making the nickel silicide (NiSi) layer as a good candidate for use in nanowires in back-end semiconductor devices. The nickel silicide layer may have a resistivity between about 10.5 ohms-cm and about 18 ohms-cm. Table I depicts the resistivity and volume per silicon atom ($Å^3$) for various phases of nickel silicide.

TABLE I

| Metal | Phase | Resistivity (Ω-cm) | Volume per Si atom ($Å^3$) |
|---|---|---|---|
| Ni | Ni | 7-10 | |
| | $Ni_3Si$ | 80-90 | |
| | $Ni_{31}Si_{12}$ | 90-150 | 39.46 |
| | $Ni_2Si$ | 24-30 | |

TABLE I-continued

| Metal | Phase | Resistivity (Ω-cm) | Volume per Si atom ($Å^3$) |
|---|---|---|---|
| | $Ni_3Si_2$ | 60-70 | |
| | $δ-Ni_3Si_2$ | | 32.15 |
| | $θ-Ni_3Si_2$ | | 30.66 |
| | NiSi | 10.5-18 | 24.12 |
| | $NiSi_2$ | 34-50 | 19.75 |
| Si | Si | | 20.01 |

Though described above with relation to nickel, metal silicide can include other metals species. According to one embodiment, the metal species in the metal silicide nanowire can also be varied depending on the application and material properties desired, such as conductivity, bandgap, work function and phase. Example metal species of interest for nanowires include Ni, Ti, Fe, Co, Cr, Mn, or other transition metal elements. The method of fabricating these nanowires can include delivery of silicon to the metal surface, delivery of the metal to silicon nanowires, or simultaneous delivery of silicon and the metal species.

In summary, some of the benefits of the present disclosure provide methods of forming low resistivity metal silicide (e.g., Ni—Si) phase at low temperatures (e.g., less than 400 degrees Celsius) that are suitable for semiconductor manufacturing applications. Processing at low temperature is desirable, due in part to the temperature budget limitation of low-k materials. However, annealing of metal silicides at temperatures lower than 400 degrees Celsius often leads to volume expansion of the metal silicide and formation of high resistivity metal-rich metal silicide phase materials. Implementations described herein provide for a confinement layer that physically reduces, chemically reduces, or both physically and chemically reduces volume expansion of the underlying silicon-containing layer and the underlying metal-containing layer during subsequent annealing processes. Thus, the confinement layer as described herein provides for the production of low resistivity metal silicides at production temperatures less than 400 degrees Celsius.

When introducing elements of the present disclosure or exemplary aspects or implementation(s) thereof, the articles "a," "an," "the" and "said" are intended to mean that there are one or more of the elements.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
   forming a silicon-containing layer on a surface of a substrate, wherein the silicon-containing layer has an exposed top surface and at least one sidewall extending from the exposed top surface to the surface of the substrate;
   forming a metal-containing layer comprising a transition metal on the exposed top surface and the at least one sidewall of the silicon-containing layer, wherein the metal-containing layer has an exposed top surface and at least one sidewall extending from the exposed top surface of the metal-containing layer to the surface of the substrate;
   forming a confinement layer on the exposed top surface and the at least one sidewall of the metal-containing layer; and annealing the substrate at a temperature of less than 400 degrees Celsius to form a metal silicide layer from the silicon-containing layer and the metal-containing layer, wherein the confinement layer inhibits formation of metal-rich metal silicide phases and the confinement layer comprises material selected from a metal-based material or an organic-based material.

2. The method of claim 1, wherein the transition metal is selected from the group consisting of Ni, Ti, Fe, Co, Cr, and Mn.

3. The method of claim 1, wherein the silicon-containing layer is formed from a silicon-containing precursor comprising silane.

4. The method of claim 1, wherein the metal silicide layer comprises nickel silicide and a majority of the nickel silicide is nickel monosilicide (NiSi) phase.

5. The method of claim 4, wherein the nickel silicide has a resistivity from about 10.5 ohms-cm to about 18 ohms-cm.

6. The method of claim 1, wherein the metal silicide layer has a thickness between about 10 Å and about 100 Å.

7. The method of claim 1, wherein the metal silicide layer is formed as nanowires for semiconductor back-end interconnection structure.

8. The method of claim 1, wherein the confinement layer is a refractory metal nitride material selected from the group consisting of titanium nitride, tantalum nitride and tungsten nitride.

9. The method of claim 1, wherein the metal-rich metal silicide phases are selected from the group consisting of: $Ni_3Si$, $Ni_{31}Si_{12}$, $Ni_2Si$, $Ni_3Si_2$, and combinations thereof.

10. A method or processing a substrate, comprising:
forming a silicon-containing nanowire on an oxide-containing surface of a substrate, wherein the silicon-containing nanowire has an exposed top surface and at least one sidewall extending from the exposed top surface to the oxide-containing surface of the substrate;
forming a nickel-containing layer on the exposed top surface and the at least one sidewall of the silicon-containing nanowire, wherein the nickel-containing layer has an exposed top surface and at least one sidewall extending from the exposed top surface of the nickel-containing layer to the oxide-containing surface of the substrate;
forming a confinement layer on the exposed top surface and the at least one sidewall of the nickel-containing layer; and
annealing the substrate at a temperature of less than 400 degrees Celsius to form a nickel monosilicide nanowire from the silicon-containing layer and the nickel-containing layer, wherein the confinement layer inhibits formation of nickel-rich nickel silicide phases and the confinement layer comprises a metal-based material or an organic-based material.

11. The method of claim 10, wherein the silicon-containing layer is formed from a silicon-containing precursor selected from the group consisting of silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof.

12. The method of claim 10, wherein the nickel-containing layer is deposited using a metal-containing precursor selected from the group consisting of Bis(N,N'-di-tert-butylacetamidinato)nickel(II), Bis(cyclopentadienyl)nickel, Bis(ethylcyclopentadienyl)nickel(II), Bis[di(tert-butyl)amido]nickel(II), and combinations thereof.

13. The method of claim 10, wherein the annealing further comprises either radiant energy activation or microwave excitation.

14. The method of claim 10, wherein the confinement layer is a refractory metal nitride material selected from the group consisting of titanium nitride, tantalum nitride and tungsten nitride.

15. The method of claim 10, wherein the nickel-rich nickel silicide phases are selected from the group consisting of: $Ni_3Si$, $Ni_{31}Si_{12}$, $Ni_2Si$, $Ni_3Si_2$, and combinations thereof.

16. A method of processing a substrate, comprising:
forming a silicon-containing nanowire on an oxide-containing surface of a substrate, the forming comprising:
depositing a silicon-containing layer on the oxide-containing surface; and
patterning the silicon-containing layer to form at least one silicon-containing nanowire on the oxide-containing surface, wherein the silicon-containing layer has an exposed top surface and at least one sidewall extending from the exposed top surface to the oxide-containing surface of the substrate;
forming a nickel-containing layer on the exposed top surface and the at least one sidewall of the silicon-containing nanowire, wherein the nickel-containing layer has an exposed top surface and at least one sidewall extending from the exposed top surface of the nickel-containing layer to the oxide-containing surface;
forming a confinement layer on the exposed top surface and the at least one sidewall of the nickel-containing layer; and
annealing the substrate at a temperature of between about 15 degrees Celsius and 400 degrees Celsius to form a nickel monosilicide nanowire from the silicon-containing nanowire and the nickel-containing layer, wherein the confinement layer inhibits formation of nickel-rich nickel silicide phases.

* * * * *

UNITED STATES PATENT AND TRADEMARK OFFICE
CERTIFICATE OF CORRECTION

PATENT NO. : 9,865,466 B2
APPLICATION NO. : 15/240410
DATED : January 9, 2018
INVENTOR(S) : Bencherki Mebarki et al.

Page 1 of 1

It is certified that error appears in the above-identified patent and that said Letters Patent is hereby corrected as shown below:

In the Specification

In Column 12, Line 6, delete "$CO_3H_7$," and insert -- $C_3H_7$, --, therefor.

Signed and Sealed this
Tenth Day of July, 2018

Andrei Iancu
*Director of the United States Patent and Trademark Office*